(12) United States Patent
Ulu et al.

(10) Patent No.: US 11,599,089 B2
(45) Date of Patent: Mar. 7, 2023

(54) BUILD DIRECTION-BASED PARTITIONING FOR CONSTRUCTION OF A PHYSICAL OBJECT THROUGH ADDITIVE MANUFACTURING

(71) Applicant: Siemens Industry Software Inc., Plano, TX (US)

(72) Inventors: Erva Ulu, Sunnyvale, CA (US); Erhan Arisoy, Princeton, NJ (US); Suraj Ravi Musuvathy, Princeton, NJ (US); David Madeley, Louth (GB); Nurcan Gecer Ulu, Sunnyvale, CA (US)

(73) Assignee: Siemens Industry Software Inc., Plano, TX (US)

( * ) Notice: Subject to any disclaimer, the term of this patent is extended or adjusted under 35 U.S.C. 154(b) by 581 days.

(21) Appl. No.: 16/472,321

(22) PCT Filed: Mar. 30, 2018

(86) PCT No.: PCT/US2018/025334
§ 371 (c)(1),
(2) Date: Jun. 21, 2019

(87) PCT Pub. No.: WO2018/191034
PCT Pub. Date: Oct. 18, 2018

(65) Prior Publication Data
US 2020/0019142 A1    Jan. 16, 2020

Related U.S. Application Data

(60) Provisional application No. 62/483,708, filed on Apr. 10, 2017.

(51) Int. Cl.
*G05B 19/4099* (2006.01)
*B33Y 50/00* (2015.01)
(Continued)

(52) U.S. Cl.
CPC ........ *G05B 19/4099* (2013.01); *B29C 64/386* (2017.08); *B33Y 50/00* (2014.12);
(Continued)

(58) Field of Classification Search
CPC ... G05B 19/4099; B33Y 50/00; B29C 64/386; G06F 30/17
(Continued)

(56) References Cited

U.S. PATENT DOCUMENTS

| 7,939,003 B2 * | 5/2011 | Bonassar | B33Y 30/00 264/308 |
| 11,022,957 B2 * | 6/2021 | Tang | G06F 30/20 |

(Continued)

FOREIGN PATENT DOCUMENTS

| CN | 103268635 A | 8/2013 |
| CN | 104778755 A | 7/2015 |

(Continued)

OTHER PUBLICATIONS

Paul et al. (Optimization of layered manufacturing process for reducing form errors with minimal support structures, Journal of Manufacturing Systems 36 (2015) 231-243) (Year: 2015).*

(Continued)

*Primary Examiner* — Iftekhar A Khan

(57) ABSTRACT

Systems and methods may support build direction-based partitioning for construction of a physical object through additive manufacturing. In some implementations, a system may access a surface mesh representative of a 3D object and an initial build direction for construction of the object using additive manufacturing. The system may partition the surface mesh into an initial buildable segment and a non-buildable segment based on the initial build direction. The system may iteratively determine subsequent build directions and partition off subsequent buildable segments from (Continued)

the unbuildable segment until no portion of the non-buildable segment remains. The determined buildable segments and correlated build directions may be provided to a multi-axis 3D printer for construction of the represented 3D object through additive manufacturing.

20 Claims, 8 Drawing Sheets

(51) Int. Cl.
   *B29C 64/386* (2017.01)
   *G06F 30/17* (2020.01)

(52) U.S. Cl.
   CPC .... *G06F 30/17* (2020.01); *G05B 2219/35134* (2013.01); *G05B 2219/49007* (2013.01); *G06F 2219/00* (2013.01)

(58) Field of Classification Search
   USPC .......................................................... 703/1
   See application file for complete search history.

(56) References Cited

U.S. PATENT DOCUMENTS

| | | | | |
|---|---|---|---|---|
| 11,230,061 | B2* | 1/2022 | Mirabella | G05B 19/4099 |
| 2008/0241404 | A1* | 10/2008 | Allaman | B29C 64/357 |
| | | | | 118/308 |
| 2012/0195994 | A1* | 8/2012 | El-Siblani | B33Y 10/00 |
| | | | | 15/320 |
| 2013/0015596 | A1* | 1/2013 | Mozeika | B29C 64/232 |
| | | | | 425/113 |
| 2014/0039659 | A1* | 2/2014 | Boyer | B33Y 40/00 |
| | | | | 700/98 |
| 2014/0277669 | A1* | 9/2014 | Nardi | G06F 30/20 |
| | | | | 700/103 |
| 2015/0145171 | A1* | 5/2015 | Walker | B33Y 40/20 |
| | | | | 425/150 |
| 2015/0151492 | A1* | 6/2015 | Schmidt | B29C 64/386 |
| | | | | 700/98 |
| 2015/0269289 | A1* | 9/2015 | Kim | G06T 17/00 |
| | | | | 703/6 |
| 2016/0067928 | A1* | 3/2016 | Mark | B29C 70/16 |
| | | | | 425/150 |
| 2016/0086376 | A1* | 3/2016 | Tang | B29C 64/386 |
| | | | | 345/420 |
| 2016/0311165 | A1* | 10/2016 | Mark | B29C 64/386 |
| 2017/0083003 | A1* | 3/2017 | Arisoy | G06F 30/00 |
| 2017/0372480 | A1* | 12/2017 | Anand | G06T 7/11 |
| 2018/0095450 | A1* | 4/2018 | Lappas | B22F 10/80 |
| 2018/0268091 | A1* | 9/2018 | Arisoy | B33Y 50/00 |
| 2018/0314235 | A1* | 11/2018 | Mirabella | G06F 30/23 |
| 2020/0004225 | A1* | 1/2020 | Buller | B29C 64/393 |
| 2020/0316849 | A1* | 10/2020 | Ohi | B33Y 80/00 |
| 2021/0103268 | A1* | 4/2021 | Tang | B22F 10/80 |

FOREIGN PATENT DOCUMENTS

| | | | |
|---|---|---|---|
| EP | 2537642 A1 | 12/2012 | |
| WO | WO-2018191034 A1 * | 10/2018 | ........... B29C 64/386 |

OTHER PUBLICATIONS

Das et al. (Selection of build orientation for optimal support structures and minimum part errors in additive manufacturing, Computer-Aided Design & Applications, 2017) (Year: 2017).*

PCT International Search Report and Written Opinion of International Searching Authority dated Jun. 29, 2018 corresponding to PCT International Application No. PCT/US2018/025334 filed Mar. 30, 2018.

Brandao, Susana et al: "Joint Alignment and Stitching of Non Overlapping Meshes".

Vaissier, Benjamin et al: "Lightweight Mesh File Format Using Repetition Pattern Encoding for Additive Manufacturing"; Computer-Aided Design; Elsevier; 2020; 129; 13 pages.

Campen, Marcel: "A Practical Guide to Polygon Mesh Repairing"; Eurographics 2012 Tutorial, 61 pages.

* cited by examiner

BUILD DIRECTION-BASED PARTITIONING FOR CONSTRUCTION OF A PHYSICAL OBJECT THROUGH ADDITIVE MANUFACTURING

CROSS REFERENCE TO RELATED APPLICATION

This application claims the benefit of priority to U.S. Provisional Application No. 62/483,708, filed on Apr. 10, 2017 and titled "SYSTEM AND METHOD FOR BUILD ORIENTATION BASED VOLUMETRIC SEGMENTATION", which is incorporated herein by reference in its entirety.

BACKGROUND

Computer systems can be used to create, use, and manage data for products and other items. Examples of computer systems include computer-aided engineering (CAE) systems, computer-aided design (CAD) systems, visualization and manufacturing systems, product data management (PDM) systems, product lifecycle management (PLM) systems, and more. These systems may include components that facilitate design and simulated testing of product structures.

SUMMARY

Disclosed implementations include systems, methods, devices, and logic that may support build direction-based partitioning for construction of a physical object through additive manufacturing and may support object decomposition along natural object boundaries and seams.

In one example, a method may be performed, executed, or otherwise carried out by a design system, such as a CAE system. The method may include accessing a surface mesh of a three-dimensional (3D) object and an initial build direction for construction of the 3D object through additive manufacturing and partitioning the surface mesh into an initial buildable segment and a non-buildable segment based on the initial build direction. The partitioning may include characterizing, based on the initial build direction, mesh faces of the surface mesh as an overhang face or a non-overhang face; clustering the mesh faces of the surface mesh according to the overhang face and non-overhang face characterizations; combining clusters including mesh faces with the non-overhang face characterization into the initial buildable segment; and combining clusters including mesh faces with the overhang face characterization into the non-buildable segment.

The method may further include correlating the initial build direction to the initial buildable segment and performing iteratively, until no portion of the non-buildable segment remains: determining a subsequent build direction; partitioning off a subsequent buildable segment from the non-buildable segment based on the subsequent build direction; and correlating the subsequent build direction to the subsequent buildable segment. The method may further yet include providing the partitioned buildable segments and correlated build directions for construction of the 3D object through additive manufacturing.

In another example, a system may include an access engine and a volumetric segmentation engine. The access engine may be configured to access a surface mesh of a 3D object and an initial build direction for construction of the 3D object through additive manufacturing. The volumetric segmentation engine may be configured to partition the surface mesh into an initial buildable segment and a non-buildable segment based on the initial build direction and according to differentiation between mesh faces of the surface mesh as overhang faces or non-overhang faces; correlate the initial build direction to the initial buildable segment; and iteratively, until no portion of the non-buildable segment remains: determine a subsequent build direction; partition off a subsequent buildable segment from the non-buildable segment based on the subsequent build direction; and correlate the subsequent build direction to the subsequent buildable segment. The volumetric segmentation engine may be further configured to provide the partitioned buildable segments and correlated build directions for construction of the 3D object through additive manufacturing.

In yet another example, a non-transitory machine-readable medium may include instructions executable by a processor to access a surface mesh of a 3D object and an initial build direction for construction of the 3D object through additive manufacturing and partition the surface mesh into an initial buildable segment and a non-buildable segment, including through: characterization, based on the initial build direction, of mesh faces of the surface mesh as an overhang face or a non-overhang face; clustering of the mesh faces of the surface mesh according to the overhang face and non-overhang face characterizations; combination of clusters including mesh faces with the non-overhang face characterization into the initial buildable segment; and combination of clusters including mesh faces with the overhang face characterization into the non-buildable segment.

The instructions may further be executable by the processor to correlate the initial build direction to the initial buildable segment and perform iteratively, until no portion of the non-buildable segment remains: determine a subsequent build direction; partition off a subsequent buildable segment from the non-buildable segment based on the subsequent build direction; and correlate the subsequent build direction to the subsequent buildable segment. The instructions may further yet be executable by the processor to provide the partitioned buildable segments and correlated build directions for construction of the 3D object through additive manufacturing.

BRIEF DESCRIPTION OF THE DRAWINGS

Certain examples are described in the following detailed description and in reference to the drawings.

DETAILED DESCRIPTION

Figure 1:
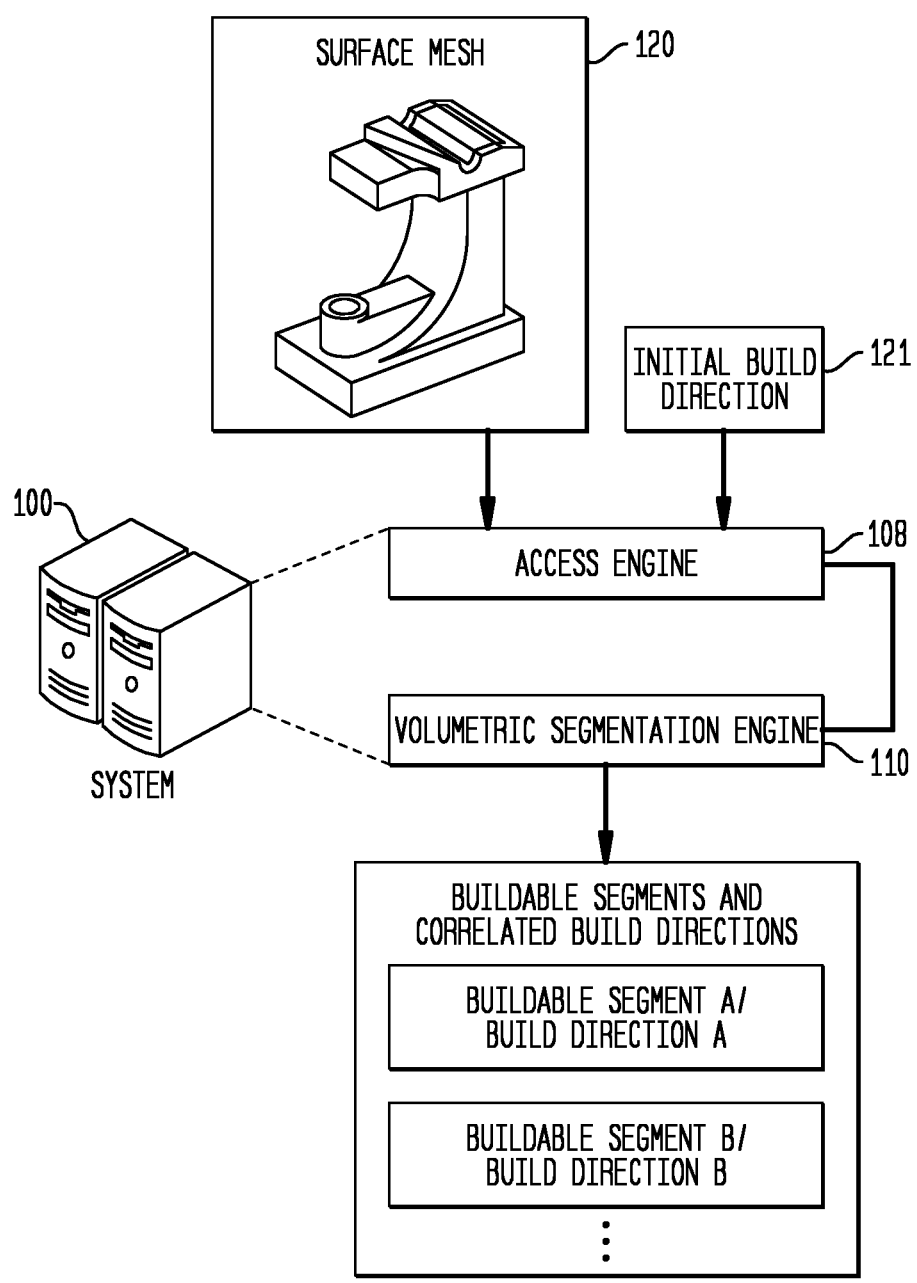
FIG. 1 shows an example of a system that supports build direction-based partitioning for construction of a physical object through additive manufacturing.

The disclosure herein may provide systems, methods, devices, and logic for build direction-based segmentation of surface meshes for additive manufacturing. Additive manufacturing (sometimes referred to as 3D printing) may be performed through use of multi-axis 3D printers that can adjust (e.g., tilt) an axis along which 3D construction is performed, doing so based on build directions specifying the axis/print orientation for such 3D printers. The features described herein may increase the efficiency and effectiveness for object construction using multi-axis 3D printers.

Determination of build orders for object construction using multi-axis 3D printers may be laborious and time consuming. Existing techniques may be limited through deconstruction by simple part geometries and can require laborious human intervention. Many such techniques are unsuitable for objects with nonplanar interfaces. In some instances, existing techniques further require the separate manufacture of object components that are later compiled and stitched together through human intervention. Such processes can be cumbersome and inefficient.

The features described herein may provide automatic or semi-automatic mechanisms to deconstruct a surface mesh representative of a 3D object into buildable segments and correlated build directions. As described in greater detail herein, a CAD or CAE system may segment a 3D surface mesh (representative of a 3D object) into multiple buildable volumes and correlated build directions. The system may partition the surface mesh into a buildable and non-buildable segment consistent with a provided initial build direction, and further deconstruct the non-buildable segment into subsequent buildable segments until a 3D build order is determined for the entire object. The order may include the partitioned buildable segments along with correlated build directions determined for each respective buildable segment, which may then be used to control manufacture of the object through a multi-axis 3D printer.

The features described herein may support construction of objects using additive manufacturing with increased efficiency and effectiveness. The described partitioning process may support determination of buildable volumes and correlated build directions for 3D object construction without further human stitching, including for objects with nonplanar interfaces. Various mesh modification and clustering features are also described herein, which may support object decomposition along natural object boundaries and seams. Such mesh modification features may result in a build order with lesser build iterations or allow for construction of larger volumes along each build direction. By reducing the number of times a 3D printer tilts the axis of printing, fewer resources may be consumed during construction.

As another example technical improvement, the features described herein may simplify the selection process of build directions for 3D construction through candidate build direction identification and selection. Doing so may reduce the complexity of the build order determination process and support determination of buildable volumes and build directions with lesser resource consumption and increased speed. These and other features are described in greater detail herein.

FIG. 1 shows an example of a system 100 that supports build direction-based partitioning of a surface mesh for construction of a physical object through additive manufacturing. The system 100 may take the form of a computing system, including a single or multiple computing devices such as application servers, compute nodes, desktop or laptop computers, smart phones or other mobile devices, tablet devices, embedded controllers, and more. In some implementations, the system 100 implements a CAD or CAE tool through which a user may design product structures for construction using additive manufacturing and specify characteristics for such construction.

As described in greater detail herein, the system 100 may access a surface mesh representative of a physical object and determine 3D buildable (or printable) segments and corresponding build directions for construction of the object using additive manufacturing. To do so, the system 100 may partition the surface mesh into an initial buildable segment and a non-buildable segment based on a provided initial build direction. The system 100 may then iteratively partition off subsequent buildable segments from the non-buildable segment until the entire surface mesh is segmented into buildable volumes, each with a correlated build direction. In effect, the system 100 may determine a build order and build directions by which a multi-axis 3D printer can construct the physical object through additive manufacturing. Through tilting the axis of construction, the 3D printer may construct the object in an order of buildable segments and correlated build directions (e.g., to which the 3D printer can set the axis of construction to) as generated by the system 100.

As an example implementation, the system 100 shown in FIG. 1 includes an access engine 108 and a volumetric segmentation engine 110. The system 100 may implement the engines 108 and 110 (and components thereof) in various ways, for example as hardware and programming. The programming for the engines 108 and 110 may take the form of processor-executable instructions stored on a non-transitory machine-readable storage medium and the hardware for the engines 108 and 110 may include a processor to execute those instructions. A processor may take the form of single processor or multi-processor systems, and in some examples, the system 100 implements multiple engines using the same computing system features or hardware components (e.g., a common processor and storage medium).

In operation, the access engine 108 may access a surface mesh 120 that represents a physical object and an initial build direction 121 to construct the physical object through additive manufacturing. The surface mesh 120 may provide a 3D representation of a physical object via mesh faces that together outline the surface of a physical object. The mesh faces that comprise the surface mesh 120 may take the form of various shapes, in some implementations as triangular mesh faces that together form the surface mesh 120 representative of a physical object.

The access engine 108 may access the surface mesh 120 from a data store or other source, whether local or remote. In some examples, the access engine 108 (or other component of the system 100) may be configured to generate the surface mesh 120 from a 3D model of a product (e.g., data specifying mathematical representations of a 3D volume/surface of objects such as solid models and shell/boundary models). Such a 3D model may be drawn by a user using CAD tools or from files (e.g., in a CAD format such as JT or STEP, or other format for storing geometric curves that define the shape of the part). In some examples, the access engine 108 may access 3D model data generated from a 3D scan of an existing physical object, from which the access engine 108 may generate or otherwise obtain the surface mesh 120. With regards to the initial build direction 121, the access engine 108 may prompt a user to specify to initial build direction 121, determine the initial build direction 121 based on an identified base of the surface mesh 120, or via other object analysis performed by a CAD or CAE tool.

In operation, the volumetric segmentation engine 110 may iteratively partition the surface mesh 120 into buildable segments (e.g., volumes) and correlate a build direction for each partitioned buildable segment. The volumetric segmentation engine 110 may continue to iterate through the partitioning process until the entire surface mesh 120 has been partitioned, resulting in a generated set of buildable segments and correlated build directions (an example of which is labeled as 130 in FIG. 1).

The volumetric segmentation engine 110 may perform different operations during iterations of partitioning the surface mesh 120 or a portion thereof. In any particular iteration, the volumetric segmentation engine 110 may identify a build direction for the iteration, characterize mesh faces as an overhang face or a non-overhang face based on the build direction, cluster the mesh faces according to the characterizations into a buildable segment and a non-buildable segment, correlate the identified build direction to the buildable segment, and determine a subsequent build direction for the next iteration. The volumetric segmentation engine 110 may repeat the process, performing the next iteration on the non-buildable segment determined from the previous iteration. The volumetric segmentation engine 110 may continue to do so until the surface mesh 120 (or modified version thereof) is entirely partitioned into buildable segments and correlated build directions.

Various features of these partitioning operations and more are described in greater detail next through FIGS. 2-5. In particular, FIG. 2-5 describe an initial iteration of a partitioning process using a surface mesh 120 and initial build direction 121 as inputs. In a consistent manner, the description and features of FIGS. 2-5 may be applied for subsequent iterations of the partitioning process as well.

Figure 2:
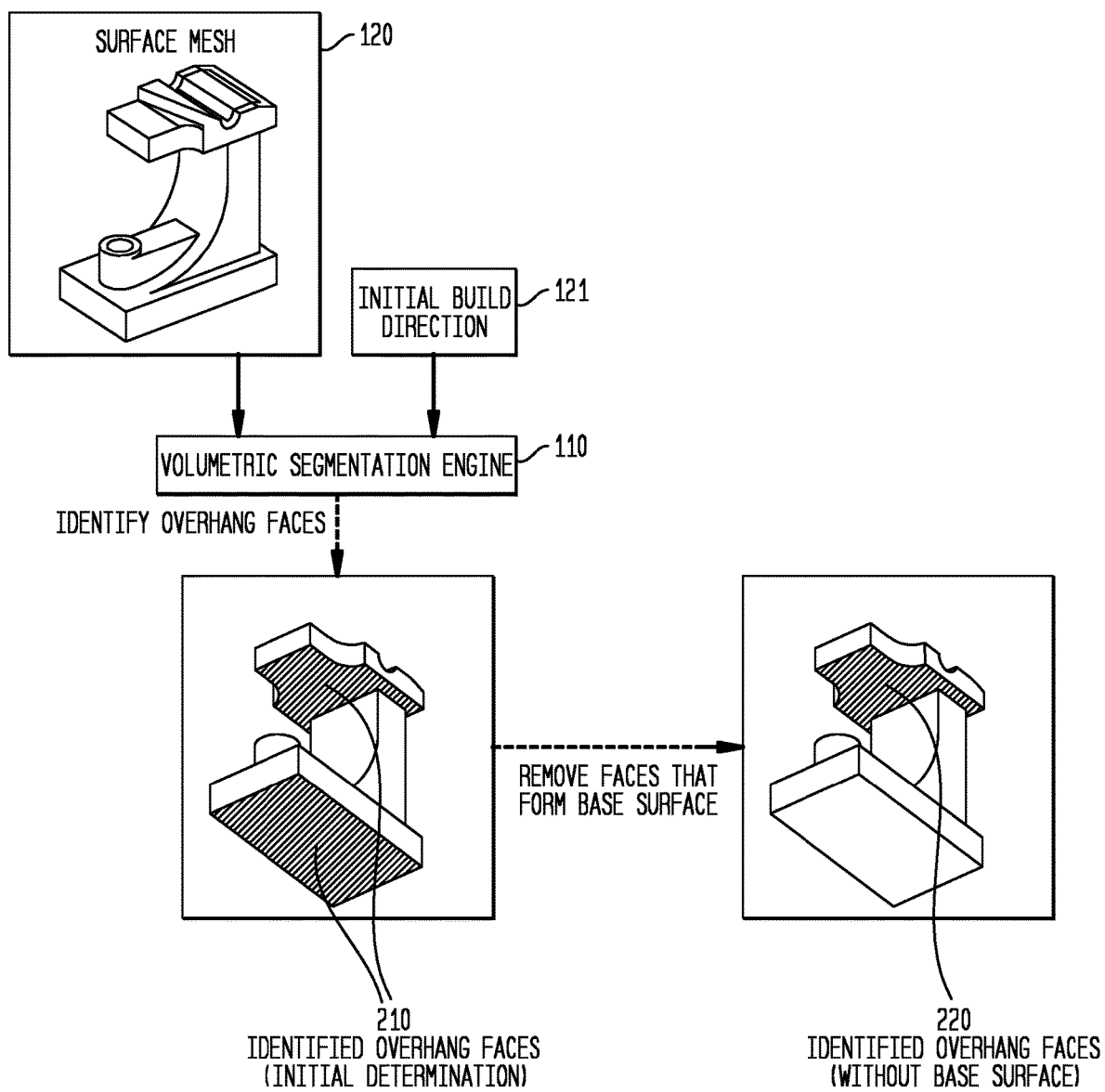
FIG. 2 shows an example of overhang face determinations by a volumetric segmentation engine.

FIG. 2 shows an example of overhang face determinations by the volumetric segmentation engine 110. As part of the partitioning process, the volumetric segmentation engine 110 may characterize mesh faces of a surface mesh 120 as either an overhang face or non-overhang face. Characterization as an overhang face may indicate that an object portion represented by a particular mesh face requires a support during construction of the physical object along a build direction, e.g., along the initial build direction 121 for overhang characterizations in the initial iteration of the partitioning process.

The volumetric segmentation engine 110 may characterize mesh faces as overhang faces of different types, two of which are actual overhang faces and effective overhang faces. The volumetric segmentation engine 110 may identify actual overhangs as the mesh faces in the surface mesh 120 that would require a support structure were the object constructed along a given build direction. In some implementations, the volumetric segmentation engine 110 may characterize mesh faces as actual overhang faces according to surface normals between the mesh faces and initial build direction 121.

Additive manufacturing methods may tolerate an overhang angle $\theta_c$ between a build direction and mesh faces. In some implementations, the volumetric segmentation engine 110 may identify an overhang of any amount from the initial build direction 121 as an actual overhang (e.g., $\theta_c=0$). In such implementations, the volumetric segmentation engine 110 may identify and characterize a mesh face as an actual overhang face responsive to a determination that the angle between the surface normal of the surface mesh and the initial build direction 121 is between 90°-180°, inclusive (between $\pi r/2$, $\pi$ radian, inclusive). In other implementations, the volumetric segmentation engine 110 may account for an allowed overhang angle $\theta_c$ and adjust the angle range accordingly in the actual overhang determination process.

In the example shown in FIG. 2, the volumetric segmentation engine 110 characterizes mesh faces of the surface mesh 120 as actual overhang faces. Through comparison of surface normals of mesh faces and the initial build direction 121, the volumetric segmentation engine 110 initially determines the identified overhang faces 210 shown in FIG. 2. As shown, the identified overhang faces 210 include a base surface of the represented object (shown as the lower highlighted surface from the identified overhang faces 210). This may be the case as the angle between a surface normal for the base surface and the initial build direction is 180°. The volumetric segmentation engine 110 may elect not to identify the base surface as an actual overhang face, particularly as the base surface may form the base from which the object is constructed along the initial build direction 121, and is thus buildable. As such, the volumetric segmentation engine 110 may remove, from the identified overhang faces 210, any mesh faces that form the base surface of the surface mesh 120 along the initial build direction 121. The resulting mesh faces identified as actual overhang faces for the surface mesh 120 are shown in FIG. 2 as the identified overhang faces 220 (without base surface).

As noted above, the volumetric segmentation engine 110 may identify mesh faces as actual overhang faces or effective overhang faces. The volumetric segmentation engine 110 may identify effective overhang faces as mesh faces of the surface mesh 120 that are not actual overhang faces (e.g., the angle between a surface normal and initial build direction 121 is outside the overhang angle range), but are positioned upon or on top of an actual overhang face along the initial build direction 121. Put another way, the volumetric segmentation engine 110 may identify effective overhang faces as mesh faces of the surface mesh 121 that are not buildable because construction of such mesh faces along the initial build direction 121 are dependent upon construction of another mesh face identified as an actual overhang face. Determination of effective overhang faces is described next in FIG. 3.

Figure 3:
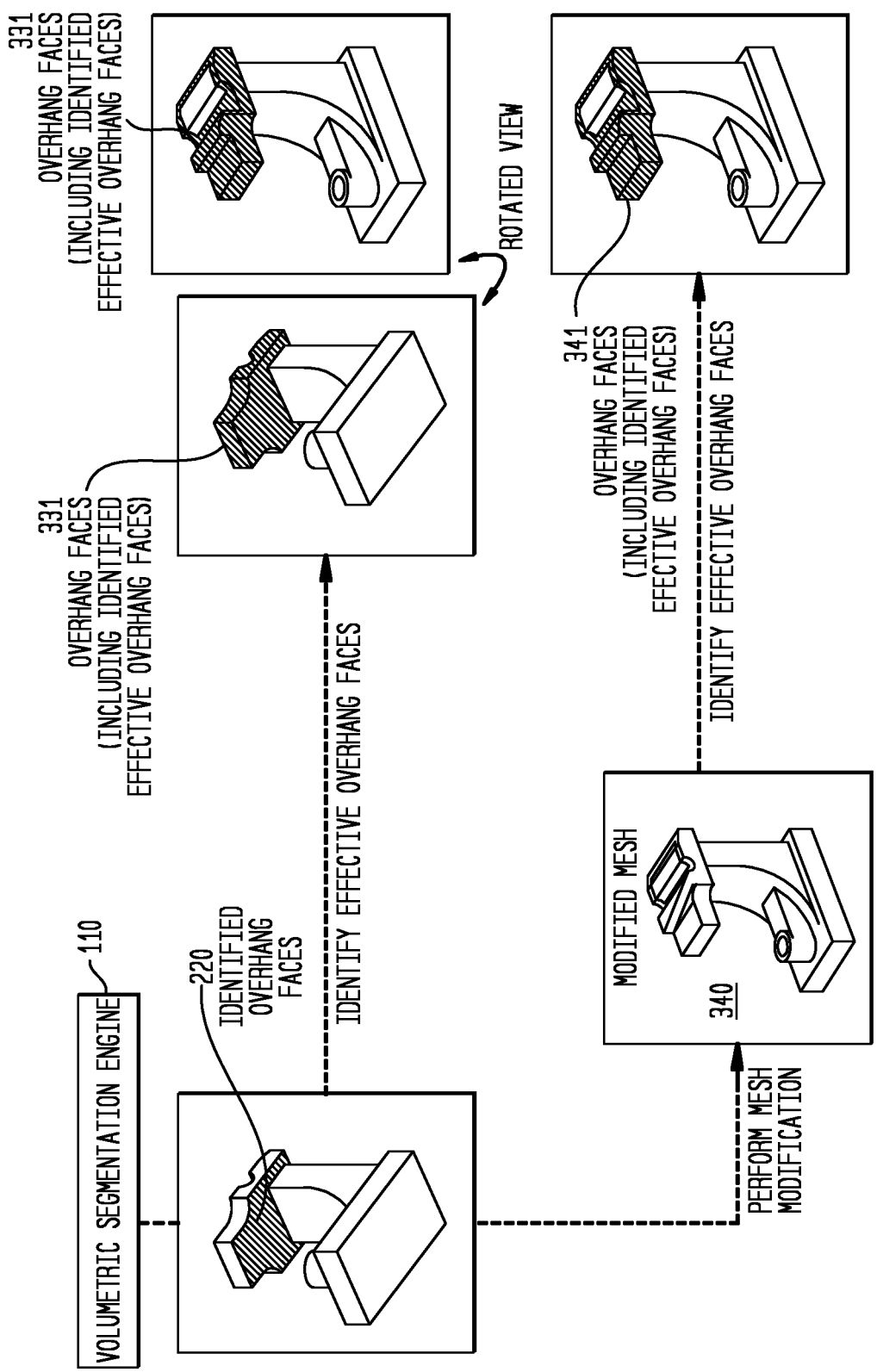
FIG. 3 shows examples of effective overhang face determinations by a volumetric segmentation engine.

FIG. 3 shows examples of effective overhang face determinations by the volumetric segmentation engine 110. The volumetric segmentation engine 110 may identify effective overhang faces in the surface mesh 120 through ray projection. In particular, the volumetric segmentation engine 110 may project rays from the center of mesh faces, and identify mesh faces as effective overhang faces based on the intersections of the projected rays. When a ray projected from the face center of a particular mesh face intersects first with another mesh face identified as an actual overhang face, the volumetric segmentation engine 110 may characterize the particular mesh face as an effective overhang face.

In any of the ways described above, the volumetric segmentation engine 110 may identify both actual overhang faces and effective overhang faces. The combined set of mesh faces including identified actual and effective overhang faces may form the set of mesh faces from the surface mesh 120 that the volumetric segmentation engine 110 characterizes as overhang faces. One such example is shown in FIG. 3 as the overhang faces 331 identified by the volumetric segmentation engine 110, which includes both actual overhang faces and effective overhang faces identified by the volumetric segmentation engine 110.

Various factors may impact the accuracy at which the volumetric segmentation engine 110 identifies mesh faces as effective overhang faces. For example, mesh quality (e.g., resolution, granularity, or size) may directly affect the accuracy in effective overhang computations by the volumetric segmentation engine 110. Even with surface meshes of higher quality, effective overhang identifications may result in misidentified mesh faces or improper characterization of partial overhang faces. A partial overhang face may refer to a mesh face with: (i) a mesh portion dependent upon construction of an actual overhang face and (ii) another mesh portion that can be constructed along a build direction without prior construction of any actual overhang face. In other words, a partial overhang face may refer to a mesh face that is partly buildable and partly non-buildable along a given build direction.

To address such issues, the volumetric segmentation engine 110 may modify a mesh such that edges of newly created mesh faces (e.g., triangles) align with overhang borders. As shown in FIG. 3, the volumetric segmentation engine 110 may modify the surface mesh 120 to obtain a modified mesh 340. To perform the mesh modification, the volumetric segmentation engine 110 may identify actual overhang faces from the surface mesh 120 and project the identified actual overhang faces onto a base plane of the object represented by the surface mesh 120 (e.g., the plane of the surface mesh 120 that includes a base of the object, according to the initial build direction 121). That is, the volumetric segmentation engine 110 may project mesh faces identified as actual overhang faces onto the base plane of the surface mesh 120.

In performing a mesh modification, the volumetric segmentation engine 110 may also determine an intersection curve between the surface mesh 120 and extrusions, along the initial build direction 121, of the projected actual overhang faces. Then, the volumetric segmentation engine 110 may project the intersection curve along the initial build direction 121 (perpendicular to the base plane), and any edges formed by the projected intersection curve intersecting with mesh faces of the surface mesh 120 are inserted to obtain the modified mesh. In effect, the volumetric segmentation engine 110 may modify the surface mesh 120 by dividing or splitting mesh faces along the projected intersection curve. Explained in yet another way, the volumetric segmentation engine 110 may insert edges that form the intersection curve into the surface mesh 120 to split mesh faces into multiple mesh faces according to the intersection curve.

Mesh modification by the volumetric segmentation engine 110 may split partial overhang faces along a projected intersection curve such that overhang and non-overhang mesh portions are split into distinct mesh faces. Partial overhang faces split along the intersection curve may result in multiple different mesh faces that are either overhang faces or non-overhang faces (and no longer partial overhang faces). In that regard, the volumetric segmentation engine 110 may split partial overhang faces along boundaries of overhang regions to ensure effective overhang portions of an object are properly characterized as such. Through such a mesh modification, the volumetric segmentation engine 110 may reduce or eliminate misidentification of partial overhang meshes during a ray projection process to identify effective overhang faces.

The volumetric segmentation engine 110 may obtain the modified mesh 340 prior to identification of effective overhang faces, as doing so may reduce or eliminate inaccurate characterization of partial overhang faces. As the mesh modification is performed specifically along the intersection curve of actual overhang faces, the volumetric segmentation engine 110 may modify the mesh to support differentiation of overhang and non-overhang faces along natural seams and boundaries of the physical object. This feature may be particularly useful for man-made shapes, such as mechanical models with crease edges, in which mesh modifications may support "clean" volumetric segmentation along shape boundaries instead of disjointed division along jagged portions of a surface mesh. By doing so, the volumetric segmentation engine 110 may increase 3D construction efficiencies, allowing construction of a 3D object with fewer build iterations and axis tilts for a multi-axis 3D printers.

After the mesh modification, the volumetric segmentation engine 110 may identify effective overhang faces in the modified mesh 340, e.g., via ray projections as described above. Upon completion of the effective overhang identification process, the volumetric segmentation engine 110 may identify mesh faces of the modified mesh as overhang faces, including both actual and effective overhang faces. An example of mesh faces identified as such from the modified mesh 340 is shown in FIG. 3 as the overhang faces 341.

The volumetric segmentation engine 110 may specify characterizations of mesh faces as overhang faces in different ways, which may depend on how a surface mesh 120 or modified mesh 340 is represented. That is, the volumetric segmentation engine 110 may represent the surface mesh 120 or modified mesh 340 in a particular form, and further specify or modify certain values or components of the representation based on the overhang determinations. In doing so, the volumetric segmentation engine 110 may control a subsequent clustering process on the modified mesh 340 to separate out buildable and non-buildable segments from the modified mesh 340

As an example, the volumetric segmentation engine 110 may construct an edge-weighted graph to represent the modified mesh 340 (this example is described terms of the modified mesh 340, but can be similarly applied to the surface mesh 120 or partitioned non-buildable segments). In representing the modified mesh 340 as an edge-weighted graph, the volumetric segmentation engine 110 may first build a dual graph of the modified mesh 340 where nodes of the graph represent the mesh faces of the modified mesh 340 and arcs of the graph represent the edges between adjacent mesh faces of the modified mesh 340. The volumetric segmentation engine 110 may then compute weights associated with the graph arcs.

The weights computed by the volumetric segmentation engine 110 may be later used to cluster nodes (representing mesh faces) in determination of a buildable and non-buildable segment from the modified mesh 340. In that regard, the volumetric segmentation engine 110 may control clustering of mesh faces according to the distinction between overhang faces and non-overhang faces through weight computations used in the edge-weighted graph. In some implementations, the weights computed by the volumetric segmentation engine 110 may include three elements (e.g., terms): a traversal cost, a cut cost, and a build cost. The traversal cost and cut cost may encourage long concave segmentation boundaries.

The build cost, in particular, may contribute in the clustering process to separate buildable clusters from un-buildable clusters based on identified overhang regions. Thus, in some examples, the volumetric segmentation engine 110 may characterize a particular mesh face as an overhang face through computed weights of edges to adjacent mesh faces, for example by weighting the build cost of an edge between an overhang face and non-overhang face in a manner to contrast and distinguish from the build cost of an edge between two overhang faces or two non-overhang faces. In a similar manner, the volumetric segmentation engine 110 may compute the traversal cost to indicate overhang faces of in the modified mesh 340.

As an illustrative example, the volumetric segmentation engine 110 may compute the cost of crossing edge i in the modified mesh 340 (represented as arc i in the constructed edge-weighted graph) as follows:

$$C_i = d_i/w_1(\theta_i) + l_i w_1(\theta_i) + d_i w_2$$

In this example, $d_i$ specifies the geodesic length of the arc, $l_i$ specifies the length of the edge on the modified mesh 340, $w_1$ specifies a concavity weight, and $w_2$ specifies an overhang weight. For exterior dihedral angle $\theta$ across an edge, the volumetric engine 110 may compute the concavity weight as follows:

$$w_1(\theta) = \min((\theta/\pi)^\alpha, 1)$$

Doing so may specify a low value for concave edges and a '1' value for convex edges. The use of concavity weights may encourage concave boundaries by increasing the cost of crossing concave edges (traversal cost) and reducing traveling through concave edges longer (cut cost). For an edge adjacent to mesh faces j and k, the volumetric segmentation engine 110 may compute the overhang weight as follows:

$$w_2 = \begin{cases} \kappa & \text{if } j \text{ or } k \text{ is identified as an overhang face} \\ 1 & \text{else} \end{cases}$$

In this example, the volumetric segmentation engine 110 may set K as a large number penalizing crossing an edge separating overhang and non-overhang regions of the object. As such, the volumetric segmentation engine 110 may characterize faces of the modified mesh 340 as an overhang face or non-overhang face and represent such characterizations in and through edge weight computations in a graph representation of the modified mesh 340 (e.g., via an overhang weight $w_2$ or via a build cost element of an edge weight).

As described above, the volumetric segmentation engine 110 may characterize mesh faces as overhang faces, including through mesh modification and identification of effective overhang faces from a modified mesh 340. For mesh faces not identified or characterized as overhang faces, the volumetric segmentation engine 110 may characterize such mesh faces as non-overhang faces. After overhang characterizations (e.g., upon construction of an edge-weighted graph for a modified mesh 340 that accounts for actual and effective overhang determinations), the volumetric segmentation engine 110 may cluster mesh faces (e.g., graph nodes) from which buildable and non-buildable segments of the modified mesh 340 are determined.

Figure 4:
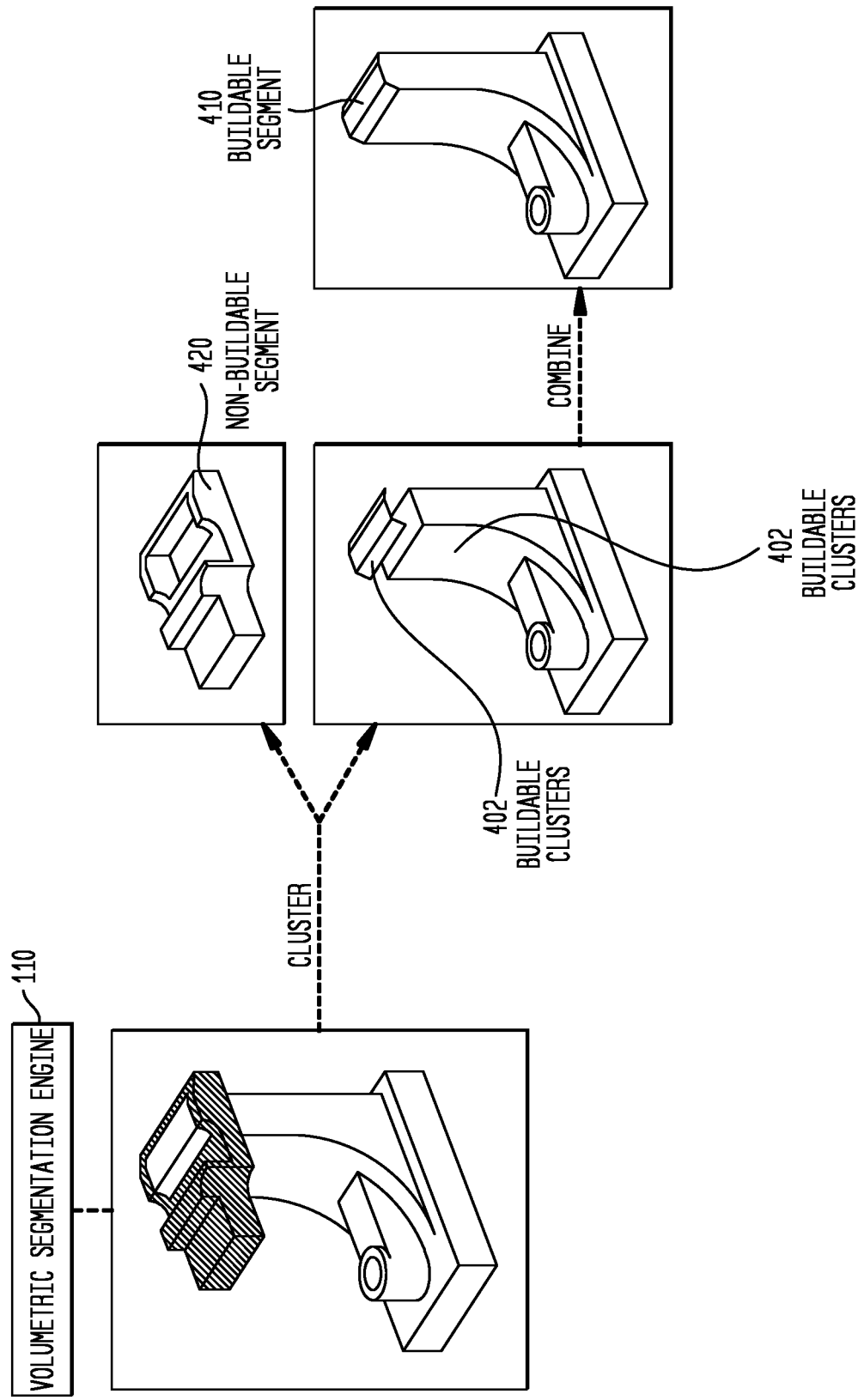
FIG. 4 shows an example of mesh clustering by a volumetric segmentation engine to partition a mesh into a buildable segment and a non-buildable segment.

FIG. 4 shows an example of mesh clustering by the volumetric segmentation engine 110 to partition a mesh into a buildable segment and a non-buildable segment. In FIG. 4, the volumetric segmentation engine 110 clusters mesh faces of a modified mesh 340 into buildable and non-buildable clusters. Through generation of the modified mesh 340 via projection of an intersection curve, the volumetric segmentation engine 110 may provide favorable segmentation boundaries that lie on natural seams of the object. As such, a clustering process applied by the volumetric segmentation engine 110 may separate buildable segments from unbuildable segments along such natural seams, allowing for increased efficiency and effectiveness in object construction through a multi-axis 3D printer.

To cluster the mesh faces, the volumetric segmentation engine 110 may apply any number of clustering techniques or processes. In some implementations, the volumetric segmentation engine 110 uses an affinity propagation method for clustering nodes of an edge-weight graph representing the modified mesh 340. By using affinity propagation, the volumetric segmentation engine 110 may ensure the resulting segmentation does not necessarily depend on initial exemplar point selection, instead considering the nodes (representing mesh faces) in the edge-weighted graph as candidate exemplars and converging to an optimal configuration iteratively.

Based on clustering parameters used by volumetric segmentation engine 110, different segmentation boundaries may result. However, the volumetric segmentation engine 110 may address extraneous or non-natural segmentation boundaries of clustering results by applying larger clustering parameters, which may allow an applied clustering process to converge to a stable solution. Through the clustering parameters, weights, graph characteristics, and techniques described above, the volumetric segmentation engine 110 may support object decomposition along natural object boundaries and seams. This may increase the efficiency of multi-axis 3D printing by more cleanly segment an object for construction and reducing the number and complexity of build iterations.

After clustering the mesh faces, the volumetric segmentation engine 110 may determine a buildable segment and non-buildable segment from the modified mesh 340. In that regard, the volumetric segmentation engine 110 may post-process the clustered mesh faces to, in effect, partition the modified mesh 340 into the buildable and non-buildable segments. To determine a buildable segment, the volumetric segmentation engine 110 may initially identify, as a buildable cluster, the cluster(s) containing the mesh faces that form the base surface of the modified mesh 340 (according to the initial build direction 121). The buildable cluster(s) identified by the volumetric segmentation engine 110 may include the base surface, which may also be referred to as a base cluster.

The volumetric segmentation engine 110 may apply buildable cluster criteria to identify whether other clustered mesh faces (in addition to the base cluster) can also be characterized as buildable. The buildable cluster criteria may be satisfied through ray casting or ray projection, e.g., in a similar manner as described previously to determine effective overhang faces. In some examples, the buildable cluster criteria are satisfied when rays projected from faces of a particular cluster first intersect with the base cluster. Responsive to a determination that rays projected from the faces in a particular cluster first intersect with the base surface (e.g., with a mesh face of the cluster(s) forming the base surface), the volumetric segmentation engine 110 may determine that the particular cluster is a buildable cluster. In some implementations, the volumetric segmentation engine 110 may apply buildable cluster criteria based on overhang characterizations previously specified by the volumetric segmentation engine 110, e.g., by determining a particular cluster satisfies the buildable cluster criteria when a threshold number of percentage of mesh faces in the particular cluster are not characterized as overhang faces (whether actual or effective).

An example of buildable clusters 402 identified by the volumetric segmentation engine 110 is shown in FIG. 4, which includes the base cluster and another cluster identified as buildable through satisfaction of the buildable cluster criteria (e.g., via ray projection). The volumetric segmentation engine 110 may characterize clusters that fail the buildable cluster criteria as non-buildable clusters. In another example, the volumetric segmentation engine 110 may identify non-buildable clusters as the clusters that include a threshold number of mesh faces characterized as overhang faces (e.g., including one or more overhang faces).

The volumetric segmentation engine 110 may divide the modified mesh 340 to separate the buildable clusters from the non-buildable clusters. Such a separation may be performed through a "cut" operation on the modified mesh 340, which may split the mesh into buildable and non-buildable portions. Doing so may result in open surfaces or disconnected meshes. As an illustrative example, an open gap is present between the buildable clusters 402 shown in FIG. 4 after separation of buildable and non-buildable clusters by the volumetric segmentation engine 110.

The volumetric segmentation engine 110 may aggregate or merge the identified buildable clusters into a single buildable segment. In some instances, the volumetric segmentation engine 110 combines the buildable clusters 402 into a closed mesh. That is, the volumetric segmentation engine 110 may generate a buildable segment from the buildable clusters 402 that itself is a closed surface mesh. As such, the volumetric segmentation engine 110 may ensure that a partitioned buildable segment identified from the modified mesh can be entirely constructed through additive manufacturing along the initial build direction 121 without additional support, without prerequisite construction of other object portions, or without human intervention. To merge the buildable clusters 402, the volumetric segmentation engine 110 may automatically perform a hole filling operation to merge the buildable clusters 402. Some CAD tools provide hole filling capabilities, which the volumetric segmentation engine 110 may leverage or use to combine the buildable clusters 402 into a single closed mesh. In some implementations, the volumetric segmentation engine 110 uses mesh stitching to combine the buildable clusters 402 together into a single closed mesh that forms a buildable segment.

The volumetric segmentation engine 110 may thus determine a buildable segment from the modified mesh 340, an example of which is shown in FIG. 4 as the buildable segment 410. As seen in FIG. 4, the volumetric segmentation engine 110 partitions the buildable segment 410 from the modified mesh 340, including by filling gaps in the buildable clusters 402 to ensure the partitioned buildable segment 410 is a closed mesh. In some instances, the volumetric segmentation engine 110 need not perform any hole filling operations as the combined buildable clusters already form a closed mesh.

The volumetric segmentation engine 110 may determine identify a non-buildable segment from the modified mesh 340 as well, shown in FIG. 4 as the non-buildable segment 420. The volumetric segmentation engine 110 may identify the non-buildable segment 420 as a combination of the non-buildable clusters (e.g., clusters that did not satisfy the buildable cluster criteria). The volumetric segmentation engine 110 need not fill any holes or gaps among the non-buildable clusters, even though such hole filling operations may be performed to merge the buildable clusters into a closed mesh. In that regard, the volumetric segmentation engine 110 may determine a non-buildable segment from the modified mesh 340 that is not a closed surface mesh.

In the various ways described above, the volumetric segmentation engine 110 may determine a buildable segment 410 and a non-buildable segment 420 from an initial surface mesh 120 input into a system 100. In the example shown in FIG. 4, the volumetric segmentation engine 110 partitions the surface mesh 120 initially provided to the system 100 into the buildable segment 410 and non-buildable segment 420, doing so through modification of the surface mesh 120 into the modified mesh 340. In this example, the partitioning of the surface mesh 120 by the volumetric segmentation engine 110 includes mesh modification such that the partitioned buildable segment 410 and non-buildable segment 420 are represented through mesh faces of the modified mesh 340, instead of the originally provided surface mesh 120.

After partitioning the surface mesh 120 into a buildable segment 410 and non-buildable segment 420, the volumetric segmentation engine 110 may correlate the initial build direction 121 to the partitioned buildable segment 410 and select a subsequent build direction for partitioning the non-buildable segment 420 in a subsequent iteration of the partitioning process.

Figure 5:
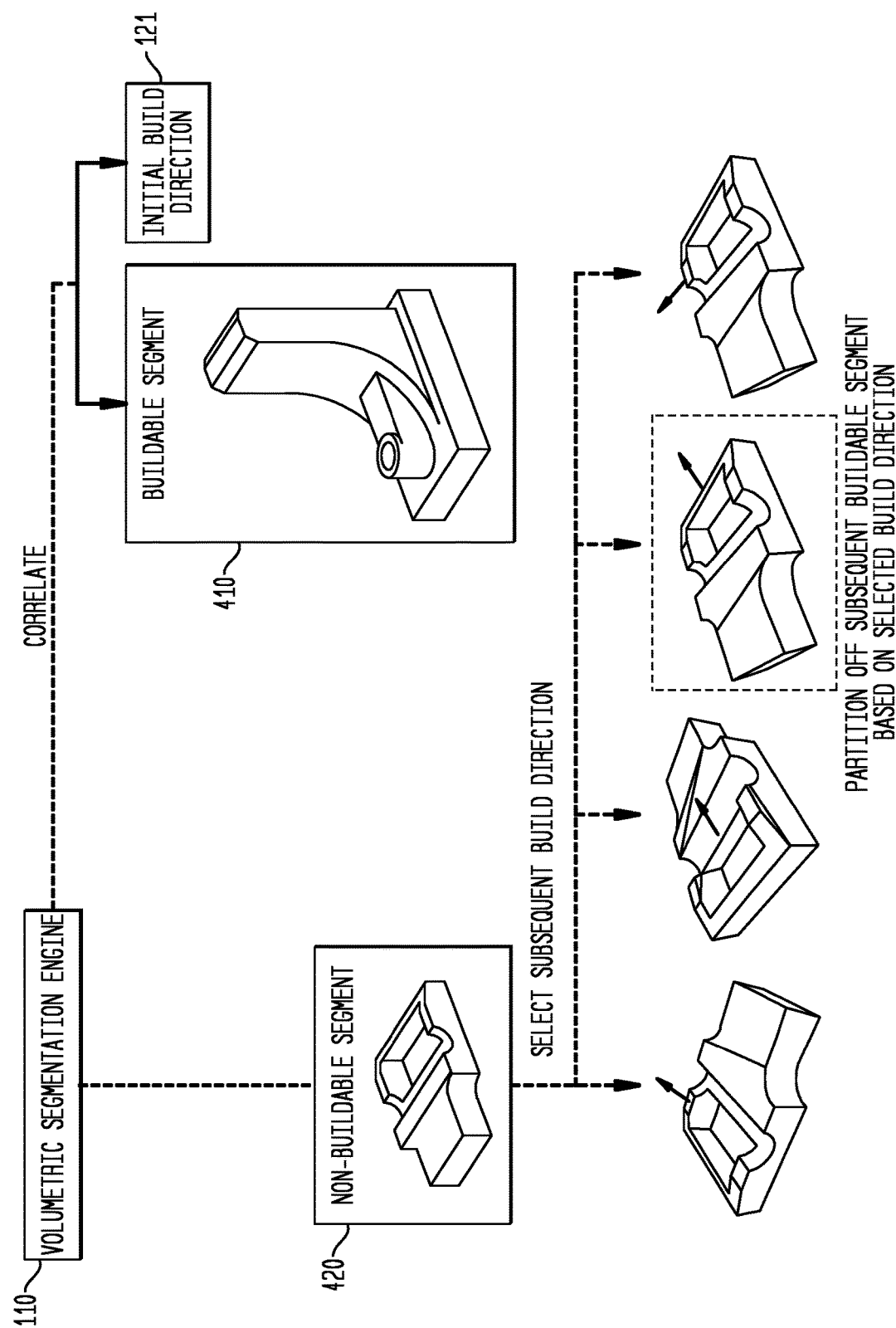
FIG. 5 shows an example of build direction correlation and subsequent build direction selection by a volumetric segmentation engine.

FIG. 5 shows an example of build direction correlation and subsequent build direction selection by the volumetric segmentation engine 110. The volumetric segmentation engine 110 may correlate the buildable segment 410 to the initial build direction 121. The actual correlation may take any form in which the buildable segment 410 is paired to, assigned to, linked with, or otherwise associated with the initial build direction 121.

By correlating the initial build direction 121 to the partitioned buildable segment 410, the volumetric segmentation engine 110 may, in essence, specify an initial build portion for a multi-axis 3D printer used to construct the physical object represented by the surface mesh 120. The buildable segment 410 (as a closed mesh) represents the portion of the object that will be first constructed along the initial build direction 121 by the multi-axis 3D printer. Subsequent iterations of the partitioning process may specify a subsequent portion of the physical object to construct, along with the corresponding build direction that the multi-axis 3D printer can pivot to in order to construct the subsequent portion. The volumetric segmentation engine 110 may provide the correlated buildable segment 410 and initial build direction 121 as an output for the first iteration of the partitioning process. Subsequent buildable segment-to-build direction pairings generated by the volumetric segmentation engine 110 may specify other build iterations for the multi-axis 3D printer in construction of the physical object.

With regards to subsequent iterations, the volumetric segmentation engine 110 may determine a subsequent build direction to apply to the non-buildable segment 420 for a next iteration of the partitioning process. The volumetric segmentation engine 110 may perform another iteration of the partitioning process upon the non-buildable segment generated from a previous iteration, with the non-buildable segment serving as an input mesh and the determined subsequent build direction serving as the build direction applicable for iteration The volumetric segmentation engine 110 may select a subsequent build direction, and do so in accordance to faces of the buildable segment 410 upon which the non-buildable segment 420 can be constructed. That is, the volumetric segmentation engine 110 may consider faces of the non-buildable segment 420 that directly contact at least a portion of the buildable segment 410 (or the combination of buildable segments from previous iterations) from which to select a subsequent build direction. To do so, the volumetric segmentation engine 110 may identify candidate build directions that are normal to interfacing surfaces between the partitioned buildable segment 410 and the non-buildable segment 420.

An example illustration of candidate build directions is shown in FIG. 5, as there are four faces of the non-buildable segment 420 that directly contact the buildable segment 410. These four faces considered in FIG. 5 serve as candidate base surfaces from which to partition off another buildable segment from the non-buildable segment 420, and the volumetric segmentation engine 110 may select the subsequent build direction accordingly (as perpendicular to one of the four possible base surfaces). The volumetric segmentation engine 110 may select the subsequent build direction according to various selection criteria, some examples of which are presented next.

As one example, the volumetric segmentation engine 110 may select the subsequent build direction as the particular candidate build direction with a highest interfacing surface area between the partitioned buildable segment 410 and the non-buildable segment 420 for the candidate build direction. Explained in a different way, the volumetric segmentation engine 110 may select the candidate build direction that has the largest base surface (by area) in the non-buildable segment 420 that directly contacts the buildable segment for that particular candidate build direction. In FIG. 5, four candidate base surfaces of the non-buildable segment 420 are shown that contact the buildable segment 410, each with an arrow showing a candidate build direction normal (i.e., perpendicular) to the respective candidate base surface. In this example, the volumetric segmentation engine 110 may select the candidate build direction with a corresponding base surface that has the highest area amongst the candidate base surfaces.

As another example, the volumetric segmentation engine 110 may select the subsequent build direction as the particular candidate build direction that would yield a partitioned buildable segment with the highest volume in the subsequent iteration of the partitioning process (such a volume may be referred to as buildable volume). In this example, the volumetric segmentation engine 110 may partition off different buildable segments from the non-buildable segment 420 multiple times, each based on a different candidate build direction. The multiple executions of the same iteration (albeit using different build directions) may result in a different partitioned buildable segment for each candidate build direction. The volumetric segmentation engine 110 may compute and track the volume of the partitioned buildable segment for each candidate build direction, and select the candidate build direction that yields the highest buildable volume for the subsequent iteration.

Such a selection process may increase computation requirements (for example, the second iteration of the partitioning process as shown in FIG. 5 would be executed four times, one for each of the candidate build directions). However, doing so may increase the efficiency of 3D object construction. Such a selection process may reduce the number of total iterations in the partitioning process, as the highest buildable volume can be achieved each iteration, which may in turn result in fewer building iterations and axis tilts by a 3D printer during object construction. In this example, the volumetric segmentation engine 110 may also perform the subsequent partitioning iteration prior to actual selection of the subsequent build direction. This may be the case as the volumetric segmentation engine 110 necessarily performs a partitioning iteration for the (eventually) selected build direction as part of the buildable volume comparison between candidate build directions. As such, selection of the subsequent build direction for the subsequent partition iteration may, in fact, occur after partition operations for the buildable segment have already been performed by the volumetric segmentation engine 110 for the subsequent iteration.

The volumetric segmentation engine 110 may thus select a subsequent build direction for a subsequent iteration of the partitioning process. In FIG. 5, the volumetric segmentation engine 110 correlates the buildable segment 410 to the initial build direction 121 as an output of a first iteration of the partitioning process and also selects the third candidate build direction illustrated in FIG. 5 as the subsequent build direction for the second iteration of the partitioning process performed on the non-buildable segment 420.

FIGS. 2-5 provide examples with respect to a surface mesh 120, modified mesh 340, and initial build direction 121 applicable to a first iteration of the partitioning process. The volumetric segmentation engine 110 may continue to iteratively process a non-buildable segment of the surface mesh 120 in a similar way, applying the overhang face characterization, mesh modification, clustering, and cluster combination features described above for each successive iteration. In applying the features above for successive iterations, the volumetric segmentation engine 110 may treat the non-buildable segment provided for a particular iteration as the "input" surface mesh and a selected subsequent build direction as the "initial" build direction and perform the partitioning operations in a consistent manner as to what was described for FIGS. 2-5 in an initial iteration.

Following the initial build iteration shown in FIGS. 2-5, the output of the second iteration performed by the volumetric segmentation engine 110 may yield a second buildable segment. The volumetric segmentation engine 110 may partition this second buildable segment from the non-buildable segment 420 and correlate this second buildable segment to a second build direction determined for the second iteration. The volumetric segmentation engine 110 may continue to select subsequent build directions (third, fourth, fifth build directions, and so on) and partition off subsequent buildable segments from the remaining non-buildable segment (third, fourth, fifth buildable segments, and so on). In an ending iteration, the volumetric segmentation engine 110 may characterize the entire remaining non-buildable segment input to the ending iteration as buildable, thus finishing the partitioning process as no further buildable characterizations would be required for the surface mesh 120 initially accessed by the access engine 110.

Figure 6:
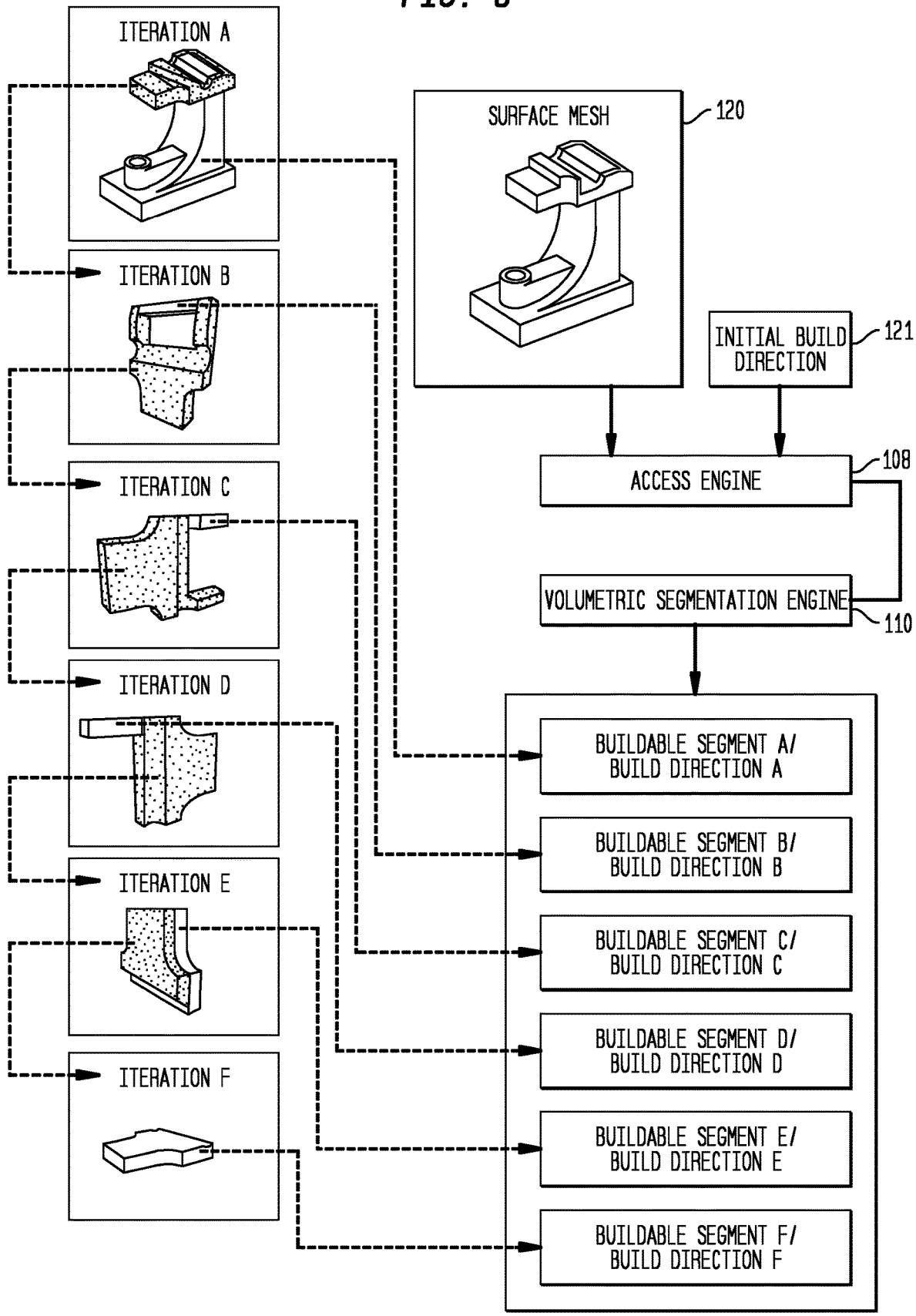
FIG. 6 shows example iterations of a build direction-based partitioning process that a system may perform.

FIG. 6 shows example iterations of a build direction-based partitioning process that a system 100 may perform. In FIG. 6, the access engine 108 obtains a surface mesh 120 and initial build direction 121 and the volumetric segmentation engine 110 generates a 3D build order that deconstructs the object represented by the surface mesh 120 into buildable segments (e.g., volumes, represented as closed meshes) and correlated build directions.

In the example shown in FIG. 6, the volumetric segmentation engine 110 performs six (6) iterations of the partitioning process, shown as iterations A-F. In each iteration, the volumetric segmentation engine 110 segments a mesh into a buildable segment and non-buildable segment, visually distinguished in each example iteration shown in FIG. 6. The volumetric segmentation engine 110 may do so according to any combination of the various partitioning features described herein. The partitioned buildable segment for a given iteration is tracked and correlated with the build direction applicable for the given iteration (e.g., user-provided as the initial build direction 121 for the initial iteration and as determined by the volumetric segmentation engine 110 for subsequent iterations). As such, the volumetric segmentation engine 110 may determine a set of buildable volumes and correlated build directions, each correlated pair output from a respective iteration of the partitioning process.

For the first iteration (iteration A shown in FIG. 6), the volumetric segmentation engine 110 partitions the obtained surface mesh 120 based on the initial build direction 121. For subsequent iterations (iterations B-F shown in FIG. 6), the volumetric segmentation engine 110 may partition the non-buildable segment resulting from the previous iteration based on a build direction determined for the given iteration. As seen in FIG. 6, the non-buildable segment (or remaining portion thereof) resulting for each iteration is passed to a subsequent iteration (e.g., the non-buildable segment determined from iteration B is provided as an input to partition for iteration C, the non-buildable segment determined from iteration C is provided as an input to partition for iteration D, and so on). The volumetric segmentation engine 110 may likewise determine and provide a build direction for a subsequent iteration as well (in FIG. 6, the determined build direction is shown as in upward orientation for each depicted iteration).

The volumetric segmentation engine 110 may continue to iteratively partition the mesh (the surface mesh 120 for the initial iteration and a respective non-buildable segment for subsequent iterations) until reaching an end condition. In FIG. 6, the volumetric segmentation engine 110 reaches the ending condition in iteration F, in which the volumetric segmentation engine 110 characterizes the entire mesh as buildable (in this case, the non-buildable segment output from iteration E). As such, the volumetric segmentation engine 110 determines that no portion of the non-buildable segment remains and concludes the partitioning process. In a general sense, the volumetric segmentation engine 110 may partition the surface mesh 120 into a buildable and non-buildable segment, and iteratively partition off subsequent buildable segments from the non-buildable segment based on determined build directions until no portion of the non-buildable segment remains.

Figure 7:
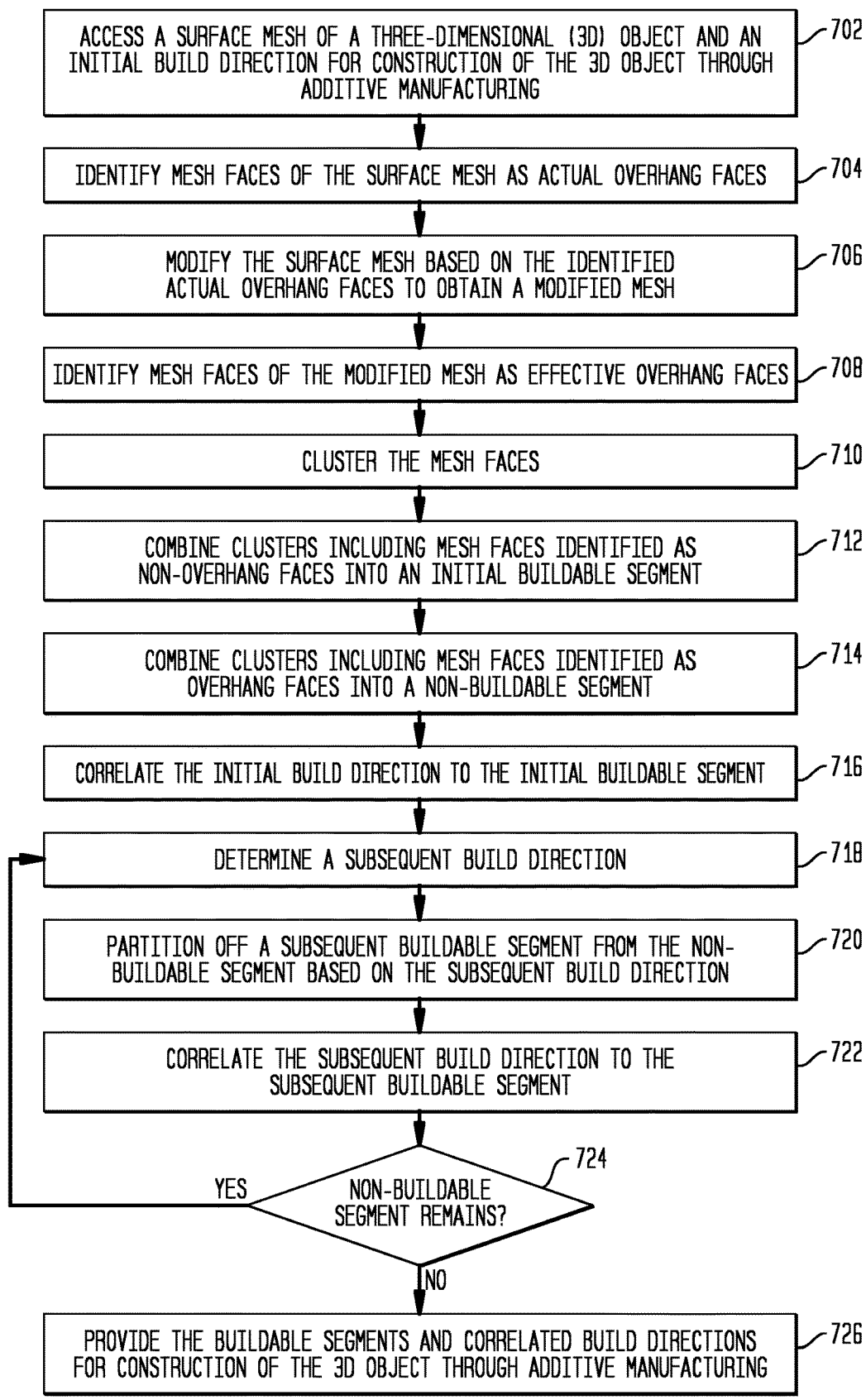
FIG. 7 shows an example of logic that a system may implement to support build direction-based partitioning for construction of a physical object through additive manufacturing.

FIG. 7 shows an example of logic 700 that a system may implement to support build direction-based partitioning for construction of a physical object through additive manufacturing. For example, the system 100 may implement the logic 700 as hardware, executable instructions stored on a machine-readable medium, or as a combination of both. The system 100 may implement the logic 700 through the access engine 108 and the volumetric segmentation engine 110, through which the system 100 may perform or execute the logic 700 as a method to partition a provided surface mesh into buildable volumes and correlated build directions for object construction through additive manufacturing. The following description of the logic 700 is provided using the access engine 108 and the volumetric segmentation engine 110 as implementation examples. However, various other implementation options by the system 100 are possible.

In implementing the logic 700, the access engine 108 may access a surface mesh of a 3D object and an initial build direction for construction of the 3D object through additive manufacturing (702). The surface mesh, initial build direction, or both may be user-provided. In implementing the logic 700, the volumetric segmentation engine 110 may partition the surface mesh (including through mesh modification), and iteratively do so until the entire surface mesh is segmented into buildable volumes with correlated build directions.

To do so, the volumetric segmentation engine 110 may identify mesh faces of the surface mesh as actual overhang faces (704). Actual overhang determinations are described above, and may include use of surface normals to characterize mesh faces as actual overhang faces requiring support during construction of the represented object along a given build direction. The volumetric segmentation engine 110 may further modify the surface mesh based on the identified actual overhang faces to obtain a modified mesh (706). As described above, the volumetric segmentation engine 110 may do so by projecting actual overhang faces unto the base surface of a mesh, and project the intersection curve along the build direction to divide mesh faces of the surface mesh.

From the modified mesh, the volumetric segmentation engine 110 may identify mesh faces of the modified mesh as effective overhang faces (708), e.g., via ray projection as described above. In identifying effective overhang faces, the volumetric segmentation engine 110 may determine that, in an additive manufacturing process along the initial build direction, a mesh face would be constructed on top of another mesh face characterized as an actual overhang face, and thus qualify as an effective over hang face.

Mesh modification may result in improved accuracy in the characterization of effective overhang faces by the volumetric segmentation engine. By projecting the intersection curve of actual over hang faces along the build direction during mesh modification, the volumetric segmentation engine 110 may, in effect, split partial overhang faces into an overhang portion and a non-overhang portion. As such, the volumetric segmentation engine 110 may identify a particular mesh face as a partial overhang face that includes a mesh portion what would qualify as an overhang face and another mesh portion that would qualify as a non-overhang face. The volumetric segmentation engine 110 may then split the particular mesh face into multiple mesh faces, characterizing each of the multiple mesh faces as an overhang face or a non-overhang face.

As noted above, the volumetric segmentation engine 110 may identify both actual overhang faces and effective overhang faces from an analyzed mesh. The volumetric segmentation engine 110 may characterize both actual overhang faces and effective overhang faces as overhang faces for a particular build direction. In some implementations, the volumetric segmentation engine 110 may characterize mesh faces of the surface mesh (or modified mesh) as overhang faces identifying a particular mesh face as an actual overhang face responsive to determining an angle between a surface normal of the particular mesh face and the initial build direction is within an overhang angle range (e.g., actual overhang determination); identifying a different mesh face as an effective overhang face even though an angle between a surface normal of the different mesh face and the initial build direction is not within the overhang angle range (e.g., effective overhang determination); and characterizing both the particular mesh face and the different mesh face as an overhang face.

Upon characterization of overhang faces in a mesh, the volumetric segmentation engine 110 may cluster mesh faces (710). In some implementations the volumetric segmentation engine 110 does so through use of a graph representation of the surface mesh (and modified mesh) and applying a clustering process to group graph nodes representative of mesh faces. Then, the volumetric segmentation engine 110 may combine clusters including mesh faces identified as non-overhang faces into an initial buildable segment (712) and combine clusters including mesh faces identified as overhang faces into a non-buildable segment (714). In some examples, the volumetric segmentation engine 110 may identify clusters using ray projections, as described above, and combination of the buildable clusters may include hole filling operations to ensure the buildable segment is a closed mesh. For instance, the volumetric segmentation engine 110 may identify a gap between a base cluster and an identified buildable cluster and fill in the gap between the base cluster and the identified buildable cluster so the initial buildable segment is a closed mesh.

The volumetric segmentation engine 110 may then correlate the initial build direction to the initial buildable segment (716), which may serve as an output for an initial iteration of the partitioning process.

When a non-buildable segment remains after completion of a given iteration of the partitioning process, the volumetric segmentation engine 110 may further partition the non-buildable segment in a subsequent iteration. For the subsequent iteration, the volumetric segmentation engine 110 may determine a subsequent build direction (718) and partition off a subsequent buildable segment from the non-buildable segment based on the subsequent build direction (720).

Various selection may be applied to determine the subsequent build direction, and some include performing operations for the subsequent iteration along candidate build directions prior to actual determination of the subsequent build direction (e.g., when applying selection criteria based on buildable volume, as described above). The volumetric segmentation engine 110 may identify candidate build directions normal to interfacing surfaces between the partitioned buildable segment and the non-buildable segment. In some examples, the volumetric segmentation engine 110 selects the subsequent build direction as a particular candidate build direction with a highest buildable volume for a subsequent buildable segment partitioned using the particular candidate build direction. In other examples, the volumetric segmentation engine 110 selects the subsequent build direction as a particular candidate build direction with a highest interfacing surface area between the partitioned buildable segment and the non-buildable segment for the candidate build direction.

In partitioning off the subsequent buildable segment, the volumetric segmentation engine 110 may apply any steps 704-714 described above upon the non-buildable segment, including overhang face determinations, mesh modification, and clustering. Then, the volumetric segmentation engine 110 may correlate the subsequent build direction to the subsequent buildable segment (722), which may serve as the output for this given iteration of the partitioning process.

The volumetric segmentation engine 110 may continue to iterate through steps 718-722 until no portion of the non-buildable segment remains (724). The resulting output of each iteration of the partitioning process may provide a build order to control operation of a multi-axis 3D printer for construction of the 3D object. As such, the volumetric segmentation engine 110 may provide the buildable segments and correlated build directions for construction of the 3D object through additive manufacturing (726). In some implementations, a system may include 3D printing capabilities to construct the 3D object according to the determined buildable segments and correlated build directions.

While one example was shown through FIG. 7, the logic 700 may include any number of additional or alternative steps as well, including any other features described herein with respect to the access engine 108, the volumetric segmentation engine 110, or both. Although an example ordering of steps is shown in FIG. 7, a system 100 may implement or perform the steps shown in FIG. 7 in different orders to partition a surface mesh into buildable segments with correlated build directions.

Figure 8:
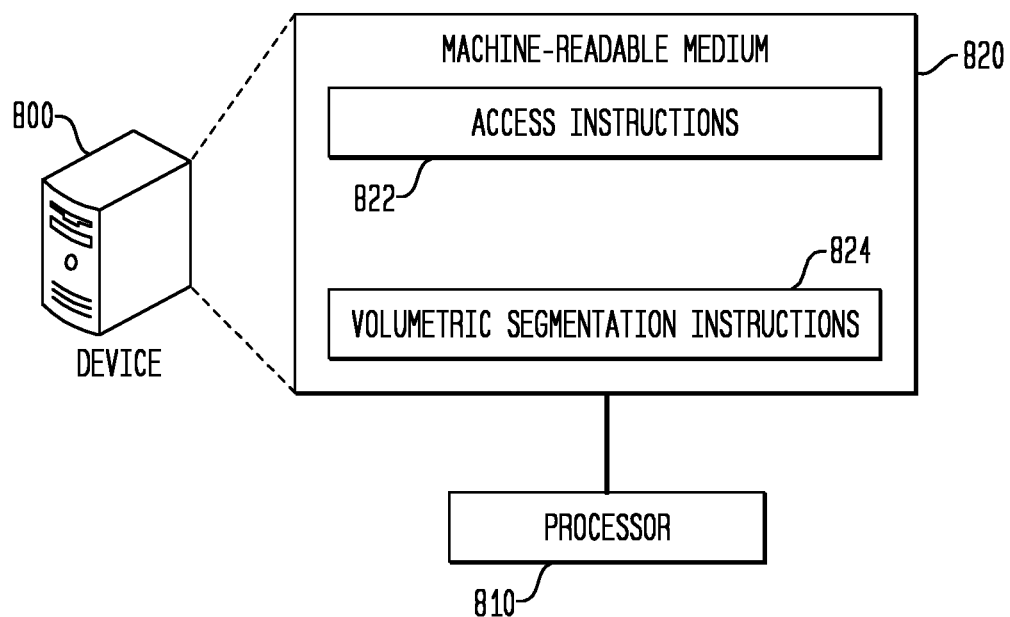
FIG. 8 shows an example of a device that may support build direction-based partitioning for construction of a physical object through additive manufacturing.

FIG. 8 shows an example of a device 800 that may support build direction-based partitioning for construction of a physical object through additive manufacturing. The device 800 may include a processor 810, which may take the form of a single or multiple processors. The processor(s) 810 may include a central processing unit (CPU), microprocessor, or any hardware device suitable for executing instructions stored on a machine-readable medium. The device 800 may include a machine-readable medium 820. The machine-readable medium 820 may take the form of any non-transitory electronic, magnetic, optical, or other physical storage device that stores executable instructions, such as the access instructions 822 and the volumetric segmentation instructions 824 shown in FIG. 8. As such, the machine-readable medium 820 may be, for example, Random Access Memory (RAM) such as a dynamic RAM (DRAM), flash memory, spin-transfer torque memory, an Electrically-Erasable Programmable Read-Only Memory (EEPROM), a storage drive, an optical disk, and the like.

The device 800 may execute instructions stored on the machine-readable medium 820 through the processor 810. Executing the instructions may cause the device 800 (or any other CAD system) to perform any of the partitioning features described herein, including according to any of the features with respect to the access engine 108, the volumetric segmentation engine 110, or a combination of both. For example, execution of the access instructions 822 by the processor 810 may cause the device 800 to access a surface mesh of a three-dimensional (3D) object and an initial build direction for construction of the 3D object through additive manufacturing.

Execution of the volumetric segmentation instructions 824 by the processor 810 may cause the device 800 to partition the surface mesh into an initial buildable segment and a non-buildable segment, including through characterization, based on the initial build direction, of mesh faces of the surface mesh as an overhang face or a non-overhang face; clustering of the mesh faces of the surface mesh according to the overhang face and non-overhang face characterizations; combination of clusters including mesh faces with the non-overhang face characterization into the initial buildable segment; and combination of clusters including mesh faces with the overhang face characterization into the non-buildable segment. Execution of the volumetric segmentation instructions 824 may further cause the processor 810 to correlate the initial build direction to the initial buildable segment; perform iteratively, until no portion of the non-buildable segment remains: determine a subsequent build direction; partition off a subsequent buildable segment from the non-buildable segment based on the subsequent build direction; and correlate the subsequent build direction to the subsequent buildable segment; as well as provide the partitioned buildable segments and correlated build directions for construction of the 3D object through additive manufacturing.

The systems, methods, devices, and logic described above, including the access engine 108 and the volumetric segmentation engine 110, may be implemented in many different ways in many different combinations of hardware, logic, circuitry, and executable instructions stored on a machine-readable medium. For example, the access engine 108, the volumetric segmentation engine 110, or combinations thereof, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine readable instructions stored on the medium, which when executed in an endpoint, computer system, or other device, cause the device to perform operations according to any of the description above, including according to any features of the access engine 108, the volumetric segmentation engine 110, or combinations of both.

The processing capability of the systems, devices, and engines described herein, including the access engine 108 and the volumetric segmentation engine 110, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:
    accessing a surface mesh of a three-dimensional (3D) object and an initial build direction for construction of the 3D object through additive manufacturing;
    partitioning the surface mesh into an initial buildable segment and a non-buildable segment based on the initial build direction, wherein the partitioning comprises:
        characterizing, based on the initial build direction, mesh faces of the surface mesh as an overhang face or a non-overhang face;
        clustering the mesh faces of the surface mesh according to the overhang face and non-overhang face characterizations;
        combining clusters including mesh faces with the non-overhang face characterization into the initial buildable segment; and
        combining clusters including mesh faces with the overhang face characterization into the non-buildable segment; and
    correlating the initial build direction to the initial buildable segment;
    performing iteratively, until no portion of the non-buildable segment remains:
        determining a subsequent build direction;
        partitioning the surface mesh into an initial buildable segment and a non-buildable segment based on the initial build direction; and
        correlating the subsequent build direction to the subsequent buildable segment; and
    providing the partitioned buildable segments and correlated build directions for construction of the 3D object through additive manufacturing.

2. The method of claim 1, wherein characterizing the mesh faces of the surface mesh as an overhang face comprises:
    identifying a particular mesh face as an actual overhang face responsive to determining an angle between a surface normal of the particular mesh face and the initial build direction is within an overhang angle range;
    identifying a different mesh face as an effective overhang face even though an angle between a surface normal of the different mesh face and the initial build direction is not within the overhang angle range; and
    characterizing both the particular mesh face and the different mesh face as an overhang face.

3. The method of claim 2, wherein identifying the different mesh face as an effective overhang face comprises:
    determining that, in an additive manufacturing process along the initial build direction, the different mesh face would be constructed on top of the particular mesh face.

4. The method of claim 2, wherein identifying the different mesh face as an effective overhang face comprises:
    determining that a ray cast from the different mesh face first intersects another mesh face characterized as an actual overhang face.

5. The method of claim 2, further comprising modifying the surface mesh prior to identifying the different mesh face as an effective overhang face by:
    projecting mesh faces identified as an actual overhang face onto a base plane for the initial build direction;
    determining an intersection curve between the surface mesh and the mesh faces projected onto the base plane; and
    inserting edges that form the intersection curve into the surface mesh to split mesh faces into multiple mesh faces according to the intersection curve.

6. The method of claim 1, wherein partitioning the surface mesh into the initial buildable segment and the non-buildable segment further comprises:
    identifying a particular mesh face as a partial overhang face that includes a mesh portion what would qualify as an overhang face and another mesh portion that would qualify as a non-overhang face; and
    splitting the particular mesh face into multiple mesh faces and characterizing each of the multiple mesh faces as an overhang face or a non-overhang face.

7. The method of claim 1, wherein combining the clusters including mesh faces with the non-overhang face characterization into the initial buildable segment comprises:
    identifying a base cluster as a cluster that includes mesh faces of a base of the 3D object according to the initial build direction;
    identifying other buildable clusters through ray casting; and
    merging the base cluster with the buildable clusters to form the initial buildable segment.

8. The method of claim 7, wherein merging the base cluster with the buildable clusters comprises:
    identifying a gap between the base cluster and an identified buildable cluster; and
    filling in the gap between the base cluster and the identified buildable cluster so the initial buildable segment is a closed mesh.

9. The method of claim 1, determining the subsequent build direction comprises:

identifying candidate build directions normal to interfacing surfaces between the partitioned buildable segment and the non-buildable segment; and selecting the subsequent build direction as a particular candidate build direction with a highest buildable volume for a subsequent buildable segment partitioned using the particular candidate build direction.

10. The method of claim 1, determining the subsequent build direction comprises:

identifying candidate build directions normal to interfacing surfaces between the partitioned buildable segment and the non-buildable segment; and selecting the subsequent build direction as a particular candidate build direction with a highest interfacing surface area between the partitioned buildable segment and the non-buildable segment for the candidate build direction.

11. A system comprising:

an access engine configured to access a surface mesh of a three-dimensional (3D) object and an initial build direction for construction of the 3D object through additive manufacturing; and a volumetric segmentation engine configured to:
partition the surface mesh into an initial buildable segment and a non-buildable segment based on the initial build direction and according to differentiation between mesh faces of the surface mesh as overhang faces or non-overhang faces;
correlate the initial build direction to the initial buildable segment; and
iteratively, until no portion of the non-buildable segment remains:
determine a subsequent build direction;
partition off a subsequent buildable segment from the non-buildable segment based on the subsequent build direction; and
correlate the subsequent build direction to the subsequent buildable segment; and
provide the partitioned buildable segments and correlated build directions for construction of the 3D object through additive manufacturing.

12. The system of claim 11, wherein the volumetric segmentation engine is configured to partition the surface mesh into the initial buildable segment and the non-buildable segment by:

characterizing, based on the initial build direction, mesh faces of the surface mesh as an overhang face or a non-overhang face;

clustering the mesh faces of the surface mesh according to the overhang face and non-overhang face characterizations;

combining clusters including mesh faces with the non-overhang face characterization into the initial buildable segment; and combining clusters including mesh faces with the overhang face characterization into the non-buildable segment.

13. The system of claim 12, wherein the volumetric segmentation engine is configured to combine the clusters including mesh faces with the non-overhang face characterization into the initial buildable segment by:

identifying a base cluster as a cluster that includes mesh faces of a base of the 3D object according to the initial build direction;

identifying other buildable clusters through ray casting; and merging the base cluster with the buildable clusters to form the initial buildable segment.

14. The system of claim 11, wherein the volumetric segmentation engine is further configured to modify the surface mesh by:

projecting mesh faces identified as an actual overhang face onto a base plane for the initial build direction;

determining an intersection curve between the surface mesh and the mesh faces projected onto the base plane;

inserting edges that form the intersection curve into the surface mesh to split mesh faces into multiple mesh faces according to the intersection curve;

identifying mesh faces as effective overhang faces; and characterizing, as overhang faces, mesh faces identified as an actual overhang face or an effective overhang face.

15. A non-transitory machine-readable medium comprising instructions, that when executed by a processor, causes a computing system to:

access a surface mesh of a three-dimensional (3D) object and an initial build direction for construction of the 3D object through additive manufacturing;

partition the surface mesh into an initial buildable segment and a non-buildable segment, including by:
characterizing, based on the initial build direction, of mesh faces of the surface mesh as an overhang face or a non-overhang face;
clustering of the mesh faces of the surface mesh according to the overhang face and non-overhang face characterizations;
combining clusters including mesh faces with the non-overhang face characterization into the initial buildable segment; and
combining clusters including mesh faces with the overhang face characterization into the non-buildable segment; and correlate the initial build direction to the initial buildable segment;

perform iteratively, until no portion of the non-buildable segment remains:
determine a subsequent build direction;
partition off a subsequent buildable segment from the non-buildable segment based on the subsequent build direction; and
correlate the subsequent build direction to the subsequent buildable segment; and provide the partitioned buildable segments and correlated build directions for construction of the 3D object through additive manufacturing.

16. The non-transitory machine-readable medium of claim 15, wherein the instructions, when executed by the processor, causes the computing system to characterize the mesh faces of the surface mesh as an overhang face by:

identifying a particular mesh face as an actual overhang face responsive to determining an angle between a surface normal of the particular mesh face and the initial build direction is within an overhang angle range;

identifying a different mesh face as an effective overhang face even though an angle between a surface normal of the different mesh face and the initial build direction is not within the overhang angle range; and characterizing both the particular mesh face and the different mesh face as an overhang face.

17. The non-transitory machine-readable medium of claim 16, wherein the instructions, when executed by the processor, causes the computing system to identify the different mesh face as an effective overhang face by:

determining that, in an additive manufacturing process along the initial build direction, the different mesh face would be constructed on top of the particular mesh face;

determining that a ray cast from the different mesh face first intersects another mesh face characterized as an actual overhang face; or a combination of both.

18. The non-transitory machine-readable medium of claim 16, wherein the instructions, when executed by the processor, further causes the computing system to modify the surface mesh prior to identifying the different mesh face as an effective overhang face by:

projecting mesh faces identified as an actual overhang face onto a base plane for the initial build direction;

determining an intersection curve between the surface mesh and the mesh faces projected onto the base plane; and inserting edges that form the intersection curve into the surface mesh to split mesh faces into multiple mesh faces according to the intersection curve.

19. The non-transitory machine-readable medium of claim 15, wherein the instructions, when executed by the processor, causes the computing system to partition the surface mesh into the initial buildable segment and the non-buildable segment further by:

identifying a particular mesh face as a partial overhang face that includes a mesh portion what would qualify as an overhang face and another mesh portion that would qualify as a non-overhang face; and splitting the particular mesh face into multiple mesh faces and characterizing each of the multiple mesh faces as an overhang face or a non-overhang face.

20. The non-transitory machine-readable medium of claim 15, wherein the instructions, when executed by the processor, causes the computing system to determine the subsequent build direction by:

identifying candidate build directions normal to interfacing surfaces between the partitioned buildable segment and the non-buildable segment; and selecting the subsequent build direction as a particular candidate build direction with a highest buildable volume for a subsequent buildable segment partitioned using the particular candidate build direction.

* * * * *